United States Patent
Hu et al.

(10) Patent No.: US 12,446,440 B2
(45) Date of Patent: Oct. 14, 2025

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Yang Hu, Wuhan (CN); Sijia Wen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 94 days.

(21) Appl. No.: 17/607,345

(22) PCT Filed: Sep. 2, 2021

(86) PCT No.: PCT/CN2021/116279
§ 371 (c)(1),
(2) Date: Jan. 26, 2023

(87) PCT Pub. No.: WO2023/000447
PCT Pub. Date: Jan. 26, 2023

(65) Prior Publication Data
US 2024/0057444 A1    Feb. 15, 2024

(30) Foreign Application Priority Data
Jul. 23, 2021   (CN) .......................... 202110835285.0

(51) Int. Cl.
*H01L 23/60* (2006.01)
*G06V 40/13* (2022.01)
(Continued)

(52) U.S. Cl.
CPC ..... *H10K 59/8722* (2023.02); *G06V 40/1318* (2022.01); *H10K 59/131* (2023.02); *H10K 59/65* (2023.02); *H10K 59/8793* (2023.02)

(58) Field of Classification Search
CPC .. H10K 59/8722; H10K 59/131; H10K 59/65; H10K 59/8793; H10K 59/126;
(Continued)

(56) References Cited

U.S. PATENT DOCUMENTS

2009/0141209 A1    6/2009   Chen et al.

FOREIGN PATENT DOCUMENTS

CN    109445215 A    3/2019
CN    110426880 A    11/2019
(Continued)

OTHER PUBLICATIONS

English Machine Translation of Jo et al. WIPO Pub. No. 2019112314 (Year: 2025).*

(Continued)

*Primary Examiner* — Donald L Raleigh
(74) *Attorney, Agent, or Firm* — PV IP PC; Wei Te Chung

(57) ABSTRACT

The present application provides a display device including a display panel; a back plate disposed on an opposite side of the light-exiting surface of the display panel; an intermediate support member disposed on a side of the back plate away from the display panel; and a conductor support member disposed on a side of the intermediate support member away from the back plate, wherein the intermediate support member is provided with an opening, and a conductive member is disposed in the opening, and wherein opposite ends of the first conductive member are in electrical contact with the conductive layer and the conductive member, respectively.

20 Claims, 6 Drawing Sheets

(51) Int. Cl.
*H10K 59/131* (2023.01)
*H10K 59/65* (2023.01)
*H10K 59/80* (2023.01)

(58) Field of Classification Search
CPC .... H10K 77/10; G06V 40/1318; H01L 23/60;
G09F 9/33
See application file for complete search history.

(56) References Cited

FOREIGN PATENT DOCUMENTS

| | | | |
|---|---|---|---|
| CN | 110718156 A | 1/2020 | |
| CN | 111339835 A | 6/2020 | |
| CN | 111409326 A | 7/2020 | |
| CN | 111914776 A | 11/2020 | |
| CN | 112349207 A | 2/2021 | |
| CN | 113066361 A | 7/2021 | |
| WO | WO-2019112314 A1 * | 6/2019 | ............. G06V 10/17 |

OTHER PUBLICATIONS

International Search Report in International application No. PCT/CN2021/116279, mailed on Mar. 28, 2022.
Written Opinion of the International Search Authority in International application No. PCT/CN2021/116279, mailed on Mar. 28, 2022.
Chinese Office Action issued in corresponding Chinese Patent Application No. 202110835285.0 dated Apr. 14, 2023, pp. 1-6.

* cited by examiner

DISPLAY DEVICE

RELATED APPLICATIONS

This application is a Notional Phase of PCT Patent Application No. PCT/CN2021/116279 having international filing date of Sep. 2, 2021, which claims the benefit of priority of Chinese Patent Application No. 202110835285.0 filed on Jul. 23, 2021. The contents of the above applications are all incorporated by reference as if fully set forth herein in their entirety.

BACKGROUND OF INVENTION

The present application claims priority to Chinese patent application no. 202110835285.0 submitted to Chinese Patent Office on Jul. 23, 2021, entitled "display device", the entire contents of which are incorporated herein by reference.

FIELD OF INVENTION

The present application relates to the field of display technology, and in particular to a display device.

DESCRIPTION OF PRIOR ART

With development of organic light-emitting diode display technology, customers have gradually increased requirements for the performance of display devices, wherein an ability to prevent electrostatic accumulation is an important indicator that affects performance of display devices. The display device generates static electricity during transportation and storage. The electrostatic accumulation and the electrostatic discharge process will cause different degrees of damage to the display device, which seriously impacts a normal display function of the display device. The display device will be provided with a back plate to support the display panel. One of main ways of electrostatic accumulation in the display device is the electrostatic accumulation on the back plate; and the electrostatic field generated by the electrostatic accumulation on the back plate to a certain extent and the electrostatic discharge process will adversely affect the display panel.

The current display device has a technical problem of electrostatic accumulation on its back plate and impacts a display function.

SUMMARY OF INVENTION

The present application provides a display device, which is used to alleviate the technical problem of electrostatic accumulation on a back plate of the current display device.

The present application provides a display device, which includes:
a display panel having a light-exiting surface;
a back plate disposed on an opposite side of the light-exiting surface of the display panel, wherein a first conductive layer is disposed on a surface of the back plate away from the display panel;
an intermediate support member disposed on a side of the back plate away from the display panel, wherein the intermediate support member is provided with a first opening, and a first conductive member is disposed in the first opening; and
a conductor support member disposed on a side of the intermediate support member away from the back plate,
wherein one end of the first conductive member is in electrical contact with the first conductive layer, and another end of the first conductive member is in electrical contact with the conductor support member.

In the display device of the present application, a second conductive layer is disposed on a surface of the back plate facing the display panel; and
a third conductive layer is disposed on at least one surface of the back plate and configured to electrically connect the first conductive layer to the second conductive layer.

In the display device of the present application, the first conductive member includes conductive adhesive filled in the first opening.

In the display device of the present application, one end of the conductive adhesive is flush with a surface of the intermediate support member close to the back plate, and is in electrical contact with the first conductive layer; and
wherein another end of the conductive adhesive is flush with a surface of the intermediate support member close to the conductor support member, and is in electrical contact with the conductor support member.

In the display device of the present application, the first opening is provided along an edge of the intermediate support member.

In the display device of the present application, the intermediate support member has a concave structure at a position corresponding to the first opening.

In the display device of the present application, at least one of the first conductive layer, the second conductive layer, and the third conductive layer includes carbon black or silver particles.

In the display device of the present application, at least one of the first conductive layer, the second conductive layer, and the third conductive layer includes a hydrophilic coating.

In the display device of the present application, the conductor support member is provided with a second opening corresponding to the first opening, and a part of the first conductive member is located in the second opening.

In the display device of the present application, the display device further includes a fingerprint recognition module disposed in the first opening and the second opening; and
wherein the first conductive member is disposed between the intermediate support member and the fingerprint recognition module, and between the conductor support member and the fingerprint recognition module.

In the display device of the present application, the first conductive member includes conductive silver adhesive disposed in the first opening and the second opening.

In the display device of the present application, a shape of an orthographic projection of the first opening on the display panel is a square or a circle.

In the display device of the present application, the intermediate support member and the conductor support member are further provided with a third opening, and the third opening penetrates through the intermediate support member and the conductor support member; and
wherein the display device further includes: a fingerprint recognition module disposed in the third opening, and a second conductive member disposed in the third opening and located between the fingerprint recognition module and the intermediate support member, and between the fingerprint recognition module and the conductor support member.

In the display device of the present application, one end of the second conductive member is in electrical contact with the first conductive layer, and another end of the second conductive member is in electrical contact with the conductor support member.

In the display device of the present application, the display device further includes a bonding connection area of an electrical terminal, and the first opening is offset from the bonding connection area.

In the display device of the present application, the first opening is located at an area corresponding to a flat area of the intermediate support member.

In the display device of the present application, the intermediate support member includes: a mesh adhesive disposed close to the back plate, and a foam disposed between the mesh adhesive and the conductor support member.

In the display device of the present application, the display device further includes: a polarizer disposed on the light-exiting surface of the display panel, an optical adhesive disposed on the polarizer, and a cover plate disposed on the optical adhesive.

In the display device of the present application, the display device further includes a fourth opening, the fourth opening penetrates through the intermediate support member and the conductor support member, and an optical element is disposed in the fourth opening.

The present application also provides a display device, which includes:
  a display panel having a light-exiting surface;
  a back plate disposed on an opposite side of the light-exiting surface of the display panel, wherein a first conductive layer is disposed on a surface of the back plate away from the display panel;
  an intermediate support member disposed on a side of the back plate away from the display panel, wherein the intermediate support member is provided with a first opening, and a first conductive member is disposed in the first opening; and
  a conductor support member disposed on a side of the intermediate support member away from the back plate, wherein one end of the first conductive member is in electrical contact with the first conductive layer, and another end of the first conductive member is in electrical contact with the conductor support member,
  wherein the display device further includes a third opening penetrating through the intermediate support member and the conductor support member; a fingerprint recognition module is provided in the third opening; a second conductive member is disposed between the fingerprint recognition module and the intermediate support member, and between the fingerprint recognition module and the conductor support member; one end of the second conductive member is in electrical contact with the first conductive layer; and another end of the second conductive member is in electrical contact with the conductor support member.

The present application provides a display device including a display panel; a back plate disposed on an opposite side of the light-exiting surface of the display panel; an intermediate support member disposed on a side of the back plate away from the display panel; and a conductor support member disposed on a side of the intermediate support member away from the back plate, wherein the intermediate support member is provided with an opening, and a conductive member is disposed in the opening, and wherein opposite ends of the first conductive member are in electrical contact with the conductive layer and the conductive member, respectively. In the present application, the conductive layer is provided on the back plate, and the conductive layer is connected to the conductor support member through the conductive member provided in the opening of the intermediate support member, so that the static electricity generated on the back plate is conducted to the conductor support member through the conductive member, and conducted out of the display device by the conductor support member, thereby alleviating the electrostatic accumulation on the back plate of the display device, and improving the reliability and display quality of the display device.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
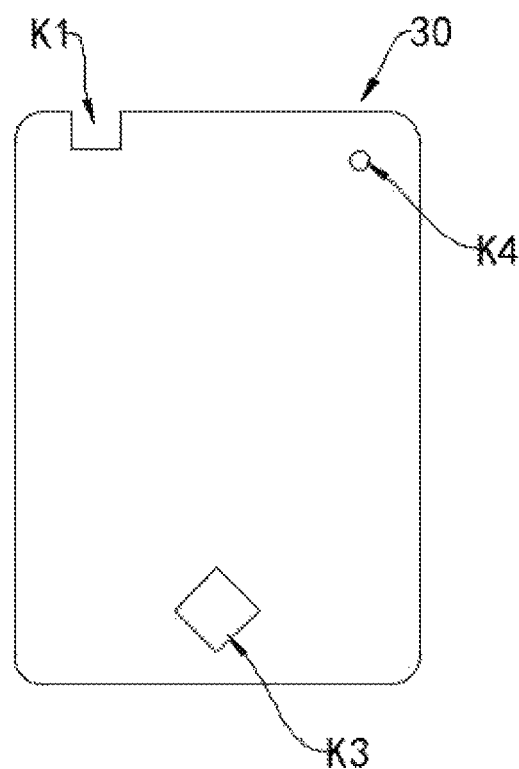
FIG. 1 is a schematic structural diagram of a back plate of a first display device provided by an embodiment of the present application.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals.

An embodiment of the present application provides a display device including a display panel; a back plate disposed on an opposite side of the light-exiting surface of the display panel; an intermediate support member disposed on a side of the back plate away from the display panel; and a conductor support member disposed on a side of the intermediate support member away from the back plate, wherein the intermediate support member is provided with an opening, and a conductive member is disposed in the opening, and wherein opposite ends of the first conductive member are in electrical contact with the conductive layer and the conductive member, respectively. In embodiments of the present application, the conductive layer is provided on the back plate, and the conductive layer is connected to the conductor support member through the conductive member provided in the opening of the intermediate support member, so that the static electricity generated on the back plate is conducted to the conductor support member through the conductive member, and conducted out of the display device by the conductor support member, thereby alleviating the electrostatic accumulation on the back plate of the display device, and improving the reliability and display quality of the display device.

The characteristics of the display device provided in the present application will be described below in conjunction with specific embodiments.

Figure 2:
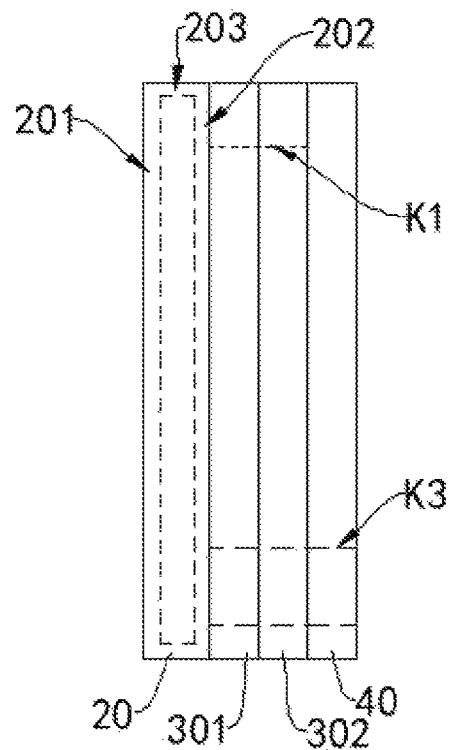
FIG. 2 is a partial side view of the first display device provided by an embodiment of the present application.
Figure 3:
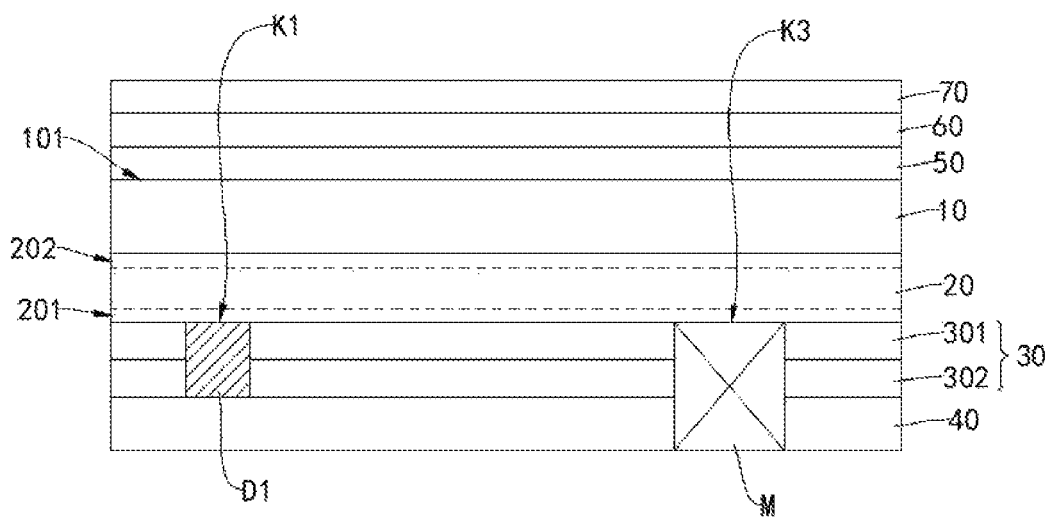
FIG. 3 is a partial layered view of the first display device provided by an embodiment of the present application.

In an embodiment, referring to FIGS. 1 to 3, FIG. 1 is a schematic structural diagram of a back plate of a first display device provided by an embodiment of the present application, FIG. 2 is a partial side view of the first display device provided by an embodiment of the present application, and FIG. 3 is a partial layered view of the first display device provided by an embodiment of the present application.

The display device includes a display panel 10, the display panel 10 has a light-exiting surface 101; and the display device further includes: a back plate 20 disposed on an opposite side of the light-exiting surface 101 of the display panel 10, an intermediate support member 30 disposed on a side of the back plate 20 away from the display panel 10, and conductor support member 40 disposed on a side of the intermediate support member 30 away from the back plate 20. The conductor support member 40 is made of a conductive material, so it has conductivity; the light-exiting surface 101 of the display panel 10 refers to a surface of the display panel 10 that has the function of displaying images; and the back plate 20, the intermediate support member 30, and the conductor support member 40 jointly support and protect the display panel 10.

Optionally, the display device further includes a polarizer 50 disposed on the side of the light-exiting surface 101 of the display panel 10, an optical adhesive 60 disposed on a side of the polarizer 50 away from the display panel, and a cover plate 70 disposed on a side of the optical adhesive 60 away from the polarizer 50. The polarizer 50 is configured to adjust the light emitted by the display panel 10 and the light emitted from outside to the display panel 10 to improve display quality and viewing angles; the optical adhesive 60 has light transmittance and is configured to bond and fix the cover plate 70 to the polarizer 50; and the cover plate 70 is configured to seal and protect internal components of the display device.

The back plate 20 is configured to support a back side of the display panel 10 to improve stiffness of the display panel 10. A first conductive layer 201 is disposed on a surface of the back plate 20 close to the intermediate support member 30. The first conductive layer 201 is made of conductive material, so it has conductivity. Static electricity generated on the surface of the back plate 20 is naturally conducted to the first conductive layer 201, so as to facilitate removal of the static electricity and eliminate the static electricity on the back plate 20.

Optionally, the back plate 20 is further provided with a second conductive layer 202 on one surface of the back plate 20 facing the display panel 10; at least one side surface of the back plate 20 is provided with a third conductive layer 203 connecting the first conductive layer 201 to the second conductive layer 202. The side surface of the back plate 20 refers to a surface of the back plate 20 excluding the surface attached to the display panel 10 and the surface attached to the intermediate support member 30. A plane on which the side surface of the back plate 20 is located intersects the display panel 10 and the intermediate support member 30 respectively at a certain angle.

In this embodiment, the second conductive layer 202 is disposed on a surface of the back plate 20 corresponding to the display panel 10, and the second conductive layer 202 is electrically connected to the first conductive layer 201 through the third conductive layer 203, so as to realize that the static electricity generated on the surface of the back plate 20 close to the display panel 10 is conducted to the first conductive layer 201 and conducted out of the surface of the back plate 20 through the first conductive layer 201 to further improve an ability to eliminate static electricity on the back plate 20.

Optionally, the third conductive layer 203 is provided on all side surfaces of the back plate 20, and all the third conductive layers 203 are electrically connected to the first conductive layer 201 and the second conductive layer 202 to realizing full encapsulation of the back plate 20 by the first conductive layer 201, the second conductive layer 202, and the third conductive layer 203, which further improves an ability to discharge static electricity on the surface of the back plate 20.

Optionally, at least one of the first conductive layer 201, the second conductive layer 202, and the third conductive layer 203 includes carbon black or silver particles, which are prepared by a manufacturing process including: preparing a conductive coating containing carbon black or silver particles, and applying the conductive coating to a corresponding surface of the back plate 20 to form a conductive coating.

Optionally, at least one of the first conductive layer 201, the second conductive layer 202, and the third conductive layer 203 includes a hydrophilic coating, which is prepared by a manufacturing process including: applying a coating containing the hydrophilic material onto the corresponding surface, or grafting a hydrophilic group onto the corresponding surface of the back plate 20 to make the surface hydrophilic. The hydrophilic coating can exhibit conductivity after absorbing a certain amount of moisture.

The intermediate support member 30 is disposed on a side of the back plate 20 away from the display panel 10. The intermediate support member 30 may be made of a material with a certain degree of flexibility, so as to achieve a buffering effect on an external force acting on the display panel 10 and the back plate 20. The intermediate support member 30 may also be made to have a porous structure to achieve an effect of venting.

Optionally, the intermediate support member 30 includes: a mesh adhesive 301 disposed close to the back plate 20, and a foam 302 disposed between the mesh adhesive 301 and the conductor support member 40; wherein the mesh adhesive 301 has functions of bonding and venting, and the foam 302 has functions of venting and buffering external forces.

The conductor support member 40 is disposed on a side of the intermediate support member 30 away from the back plate 20, and the conductor support member 40 has functions of dissipating heat and conducting static electricity. Optionally, in order to achieve better heat dissipation and conductivity of the conductor support member 40, the conductor support member 40 may be made of copper foil.

Further, the intermediate support member 30 is provided with a first opening K1, the first opening K1 penetrates the intermediate support member 30 along a thickness direction of the intermediate support member 30; a first conductive member D1 is provided in the first opening K1, one end of the first conductive member D1 is in electrical contact with the first conductive layer 201, and another end of the first conductive member D1 is in electrical contact with the conductor support member 40. The first conductive member D1 electrically connects the first conductive layer 201 to the conductor support member 40, so that the static electricity generated on the back plate 20 is conducted to the conductor support member 40, and the static electricity is eliminated by grounding the conductor support member 40.

Optionally, the first opening K1 may be provided along an edge of the intermediate support member 30, and the first opening K1 cuts off the edge of the intermediate support member 30, so that the intermediate support member 30 forms a concave structure corresponding to a position of the first opening K1, and this structure can facilitate smooth discharge of a gas in the first opening K1.

Optionally, a shape of an orthographic projection of the first opening K1 on the display panel 10 may be a square, a circle, an ellipse, or other shapes including some arcs or some squares.

Further, the first conductive member D1 is made of conductive adhesive, and one end of the conductive adhesive is flush with a surface of the intermediate support member 30 on the side close to the back plate 20 and is aligned with the first conductive layer. 201 is in electrical contact; another end of the conductive adhesive is flush with the surface of the intermediate support member 30 close to the conductor support member 40, and is in electrical contact with the conductor support member 40.

In this embodiment, the conductive adhesive is filled in the first opening K1, making a thickness of the conductive adhesive equal to a thickness of the intermediate support member 30 to ensure electrically connection between the first conductive layer 201 and the conductor support member 40 through the conductive adhesive, while preventing a height difference at the first opening K1, which is beneficial to improve flatness of the display device.

Further, the display device has a bonding connection area of an electrical terminal, and the first opening K1 is offset from the bonding connection area to prevent an effect of a thermal pressing process used in a bonding connection of the electrical terminal at the first opening K1, causing an area where the first opening K1 is located to be recessed.

Further, the first opening K1 is located in an area corresponding to a flat area of the intermediate support member 30, and the flat area refers to an area where upper and lower surfaces of the intermediate support member 30 are flat without a height difference or curvature.

Optionally, the display device further includes a third opening K3 provided on the intermediate support member 30 and the conductor support member 40, and the third opening K3 penetrates the intermediate support member 30 and the conductor support member 40. The display device further includes a fingerprint recognition module M disposed in the third opening K3, and the fingerprint recognition module M is configured to realize a fingerprint recognition function of the display device.

Optionally, the display device further includes a fourth opening K4, the fourth opening K4 can penetrate the intermediate support member 30 and the conductor support member 40, and the fourth opening K4 is provided with an optical components, such as a camera, etc.

Figure 4:
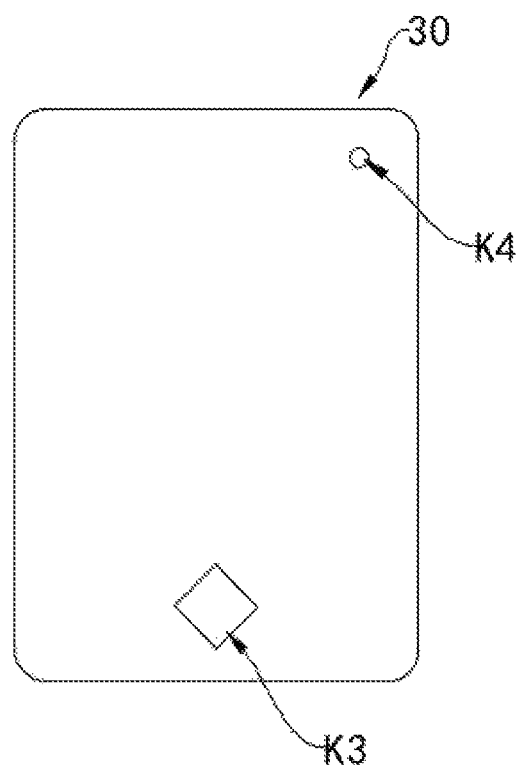
FIG. 4 is a schematic structural diagram of a back plate of a second display device provided by an embodiment of the present application.
Figure 5:
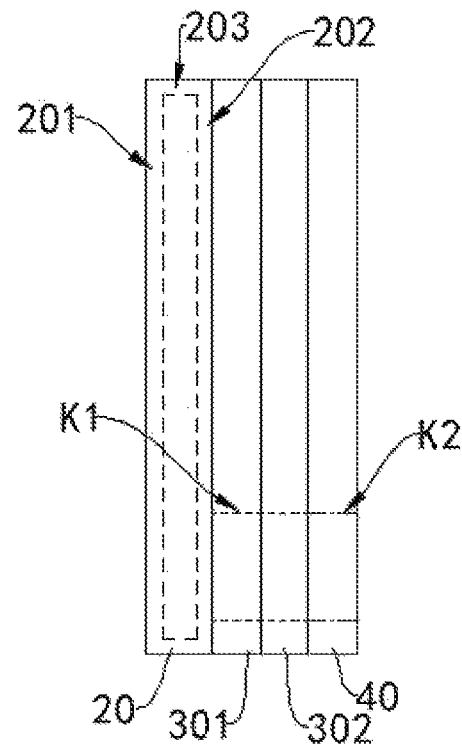
FIG. 5 is a partial side view of the second display device provided by an embodiment of the present application.
Figure 6:
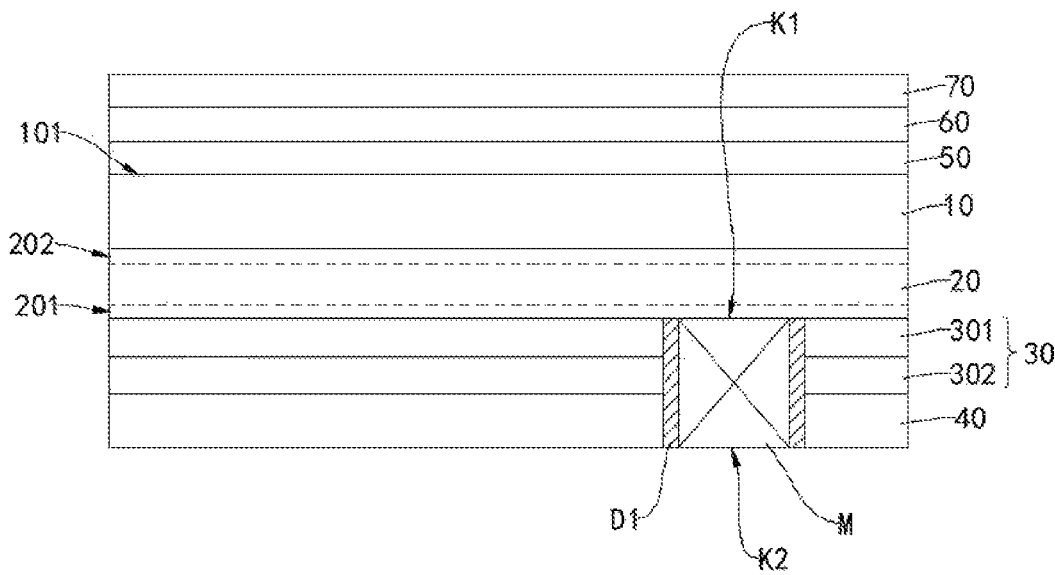
FIG. 6 is a partial layered view of a second display device provided by an embodiment of the present application.

In an embodiment, referring to FIGS. 4 to 6, FIG. 4 is a schematic structural diagram of a back plate of a second display device provided by an embodiment of the present application, FIG. 5 is a partial side view of the second display device provided by an embodiment of the present application, and FIG. 6 is a partial layered view of a second display device provided by an embodiment of the present application. It should be noted that some structural features of the display device described in this embodiment are the same as or similar to those in the foregoing embodiments. The display device provided in this embodiment will be described below, and details that are not described can be referred to the description of the foregoing embodiments.

The display device includes: a display panel 10, a back plate 20 disposed on an opposite side of the light-exiting surface 101 of the display panel 10, an intermediate support member 30 disposed on a side of the back plate 20 away from the display panel 10, and conductor support member 40 disposed on a side of the intermediate support member 30 away from the back plate 20. The conductor support member 40 is made of a conductive material, so it has conductivity; the light-exiting surface 101 of the display panel 10 refers to a surface of the display panel 10 that has the function of displaying images; and the back plate 20, the intermediate support member 30, and the conductor support member 40 jointly support and protect the display panel 10.

The display device further includes a polarizer 50 disposed on the side of the light-exiting surface 101 of the display panel 10, an optical adhesive 60 disposed on a side of the polarizer 50 away from the display panel, and a cover plate 70 disposed on a side of the optical adhesive 60 away from the polarizer 50.

The back plate 20 is configured to support a back side of the display panel 10 to improve stiffness of the display panel 10. A first conductive layer 201 is disposed on a surface of the back plate 20 close to the intermediate support member 30. The first conductive layer 201 is made of conductive material, so it has conductivity. Static electricity generated on the surface of the back plate 20 is naturally conducted to the first conductive layer 201, so as to facilitate removal of the static electricity and eliminate the static electricity on the back plate 20.

Optionally, the back plate 20 is further provided with a second conductive layer 202 on one surface of the back plate 20 facing the display panel 10; at least one side surface of the back plate 20 is provided with a third conductive layer 203 connecting the first conductive layer 201 to the second conductive layer 202.

Optionally, the third conductive layer 203 is provided on all side surfaces of the back plate 20, and all the third conductive layers 203 are electrically connected to the first conductive layer 201 and the second conductive layer 202 to realizing full encapsulation of the back plate 20 by the first conductive layer 201, the second conductive layer 202, and the third conductive layer 203.

Optionally, at least one of the first conductive layer 201, the second conductive layer 202, and the third conductive layer 203 includes carbon black or silver particles, which are prepared by a manufacturing process including: preparing a conductive coating containing carbon black or silver particles, and applying the conductive coating to a corresponding surface of the back plate 20 to form a conductive coating.

Optionally, at least one of the first conductive layer 201, the second conductive layer 202, and the third conductive layer 203 includes a hydrophilic coating, which is prepared by a manufacturing process including: applying a coating containing the hydrophilic material onto the corresponding surface, or grafting a hydrophilic group onto the corresponding surface of the back plate 20 to make the surface hydrophilic. The hydrophilic coating can exhibit conductivity after absorbing a certain amount of moisture.

The intermediate support member 30 is disposed on a side of the back plate 20 away from the display panel 10. The intermediate support member 30 may be made of a material with a certain degree of flexibility, so as to achieve a buffering effect on an external force acting on the display panel 10 and the back plate 20. The intermediate support member 30 may also be made to have a porous structure to achieve an effect of venting.

Optionally, the intermediate support member 30 includes: a mesh adhesive 301 disposed close to the back plate 20, and a foam 302 disposed between the mesh adhesive 301 and the conductor support member 40; wherein the mesh adhesive 301 has functions of bonding and venting, and the foam 302 has functions of venting and buffering external forces.

The conductor support member 40 is disposed on a side of the intermediate support member 30 away from the back plate 20, and the conductor support member 40 has functions of dissipating heat and conducting static electricity. Optionally, in order to achieve better heat dissipation and conductivity of the conductor support member 40, the conductor support member 40 may be made of copper foil.

Further, the intermediate support member 30 is provided with a first opening K1, the conductor support member 40 is provided with a second opening K2, and the first opening K1 penetrates through the intermediate support member 30 along a thickness direction of the intermediate support member 30, and the second opening K2 penetrates the conductor support member 40 along a thickness direction of the conductor support member 40, and the first opening K1 and the second opening K2 are provided correspondingly.

The display device further includes a fingerprint recognition module M disposed in the first opening K1 and the second opening K2, and the fingerprint recognition module M is configured to realize the fingerprint recognition function of the display device.

The display device further includes a first conductive member D1 disposed in the first opening K1 and the second opening K2, and the first conductive member D1 is located between the intermediate support member 30 and the fingerprint recognition modules M and between the conductor support member 40 and the fingerprint recognition module M. One end of the first conductive member D1 is in electrical contact with the first conductive layer 201, and another end of the first conductive member D1 is in electrical contact with the conductor support member 40. The first conductive member D1 electrically connects the first conductive layer 201 to the conductor support member 40, so that the static electricity generated on the back plate 20 is conducted to the conductor support member 40, and the static electricity is eliminated by grounding the conductor support member 40.

Optionally, the first conductive member D1 includes conductive silver adhesive disposed in the first opening K1 and the second opening K2. A method of making the conductive silver adhesive in the first opening K1 and the second opening K2 includes: preparing a conductive adhesive containing silver particles, and bonding the conductive adhesive to inner walls of the first opening K1 and the second opening K2, to make the conductive silver adhesive and the fingerprint recognition module M not overlap each other.

Optionally, a shape of an orthographic projection of each of the first opening K1 and the second opening K2 on the display panel 10 may be a square, a circle, an ellipse, or other shapes including some arcs or squares.

Optionally, the display device further includes a fourth opening K4, the fourth opening K4 can penetrate the intermediate support member 30 and the conductor support member 40, and the fourth opening K4 is provided with an optical components, such as a camera, etc.

Figure 7:
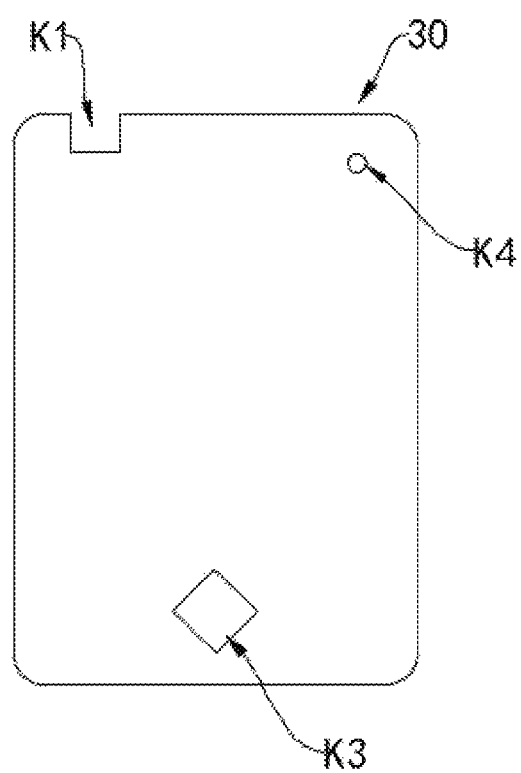
FIG. 7 is a schematic structural diagram of a back plate of a third display device provided by an embodiment of the present application.
Figure 8:
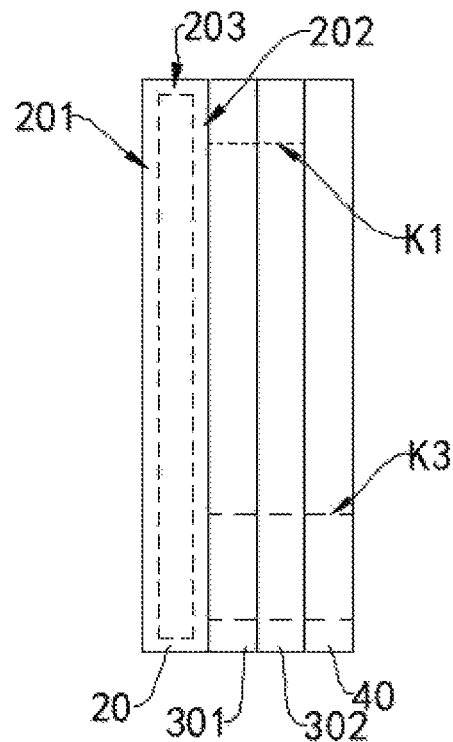
FIG. 8 is a partial side view of the third display device provided by an embodiment of the present application.
Figure 9:
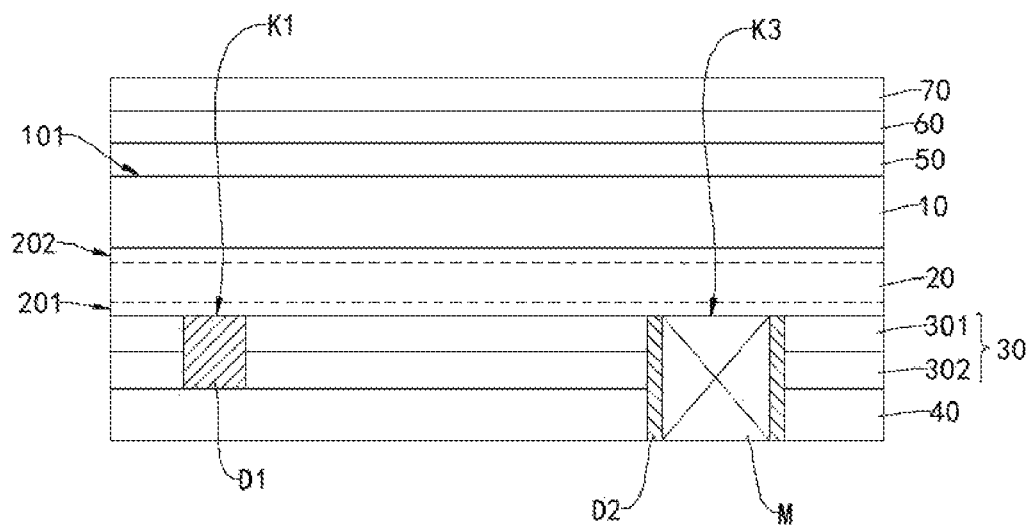
FIG. 9 is a partial layered view of the third display device provided by an embodiment of the present application.

In an embodiment, referring to FIGS. 7-9, FIG. 7 is a schematic structural diagram of a back plate of a third display device provided by an embodiment of the present application, FIG. 8 is a partial side view of the third display device provided by an embodiment of the present application, and FIG. 9 is a partial layered view of the third display device provided by an embodiment of the present application. It should be noted that some structural features of the display device described in this embodiment are the same as or similar to those in the foregoing embodiments. The display device provided in this embodiment will be described below, and details that are not described can be referred to the description of the foregoing embodiments.

The display device includes: a display panel 10, a back plate 20 disposed on an opposite side of the light-exiting surface 101 of the display panel 10, an intermediate support member 30 disposed on a side of the back plate 20 away from the display panel 10, and conductor support member 40 disposed on a side of the intermediate support member 30 away from the back plate 20. The conductor support member 40 is made of a conductive material, so it has conductivity; the light-exiting surface 101 of the display panel 10 refers to a surface of the display panel 10 that has the function of displaying images; and the back plate 20, the intermediate support member 30, and the conductor support member 40 jointly support and protect the display panel 10.

The display device further includes a polarizer 50 disposed on the side of the light-exiting surface 101 of the display panel 10, an optical adhesive 60 disposed on a side of the polarizer 50 away from the display panel, and a cover plate 70 disposed on a side of the optical adhesive 60 away from the polarizer 50.

The back plate 20 is configured to support a back side of the display panel 10 to improve stiffness of the display panel 10. A first conductive layer 201 is disposed on a surface of the back plate 20 close to the intermediate support member 30. The first conductive layer 201 is made of conductive material, so it has conductivity. Static electricity generated on the surface of the back plate 20 is naturally conducted to the first conductive layer 201, so as to facilitate removal of the static electricity and eliminate the static electricity on the back plate 20.

Optionally, the back plate 20 is further provided with a second conductive layer 202 on one surface of the back plate 20 facing the display panel 10; at least one side surface of the back plate 20 is provided with a third conductive layer 203 connecting the first conductive layer 201 to the second conductive layer 202.

Optionally, the third conductive layer 203 is provided on all side surfaces of the back plate 20, and all the third conductive layers 203 are electrically connected to the first conductive layer 201 and the second conductive layer 202 to realizing full encapsulation of the back plate 20 by the first conductive layer 201, the second conductive layer 202, and the third conductive layer 203.

Optionally, at least one of the first conductive layer 201, the second conductive layer 202, and the third conductive layer 203 includes carbon black or silver particles, which are prepared by a manufacturing process including: preparing a conductive coating containing carbon black or silver particles, and applying the conductive coating to a corresponding surface of the back plate 20 to form a conductive coating.

Optionally, at least one of the first conductive layer 201, the second conductive layer 202, and the third conductive layer 203 includes a hydrophilic coating, which is prepared by a manufacturing process including: applying a coating containing the hydrophilic material onto the corresponding surface, or grafting a hydrophilic group onto the corresponding surface of the back plate 20 to make the surface hydrophilic. The hydrophilic coating can exhibit conductivity after absorbing a certain amount of moisture.

The intermediate support member 30 is disposed on a side of the back plate 20 away from the display panel 10. The intermediate support member 30 may be made of a material with a certain degree of flexibility, so as to achieve a buffering effect on an external force acting on the display panel 10 and the back plate 20. The intermediate support member 30 may also be made to have a porous structure to achieve an effect of venting.

Optionally, the intermediate support member 30 includes: a mesh adhesive 301 disposed close to the back plate 20, and a foam 302 disposed between the mesh adhesive 301 and the conductor support member 40; wherein the mesh adhesive 301 has functions of bonding and venting, and the foam 302 has functions of venting and buffering external forces.

The conductor support member 40 is disposed on a side of the intermediate support member 30 away from the back plate 20, and the conductor support member 40 has functions of dissipating heat and conducting static electricity. Optionally, in order to achieve better heat dissipation and conductivity of the conductor support member 40, the conductor support member 40 may be made of copper foil.

Further, the intermediate support member 30 is provided with a first opening K1, the first opening K1 penetrates the intermediate support member 30 along a thickness direction of the intermediate support member 30; a first conductive member D1 is provided in the first opening K1, one end of the first conductive member D1 is in electrical contact with the first conductive layer 201, and another end of the first conductive member D1 is in electrical contact with the conductor support member 40. The first conductive member D1 electrically connects the first conductive layer 201 to the conductor support member 40, so that the static electricity generated on the back plate 20 is conducted to the conductor support member 40, and the static electricity is eliminated by grounding the conductor support member 40.

Further, the display device further includes a third opening K3 provided on the intermediate support member 30 and the conductor support 40, and the third opening K3 penetrates the intermediate support member 30 and the conductor support member 40. A fingerprint recognition module M and a second conductive member D2 are arranged in the third opening K3. The second conductive member D2 is located between the intermediate support 30 and the fingerprint recognition module M, and between the conductor support 40 and the fingerprint recognition module M. One end of the second conductive member D2 is in electrical contact with the first conductive layer 201, and the other end of the second conductive member D2 is in electrical contact with the conductor support 40. The second conductive member D2 electrically connects the first conductive layer 201 and the conductor support 40 together, and further improves the ability to eliminate static electricity on the back plate 20.

The first conductive member D1 is made of conductive adhesive, one end of the conductive adhesive is flush with the surface of the intermediate support member 30 on the side close to the back plate 20, and another end of the conductive adhesive is flush with a surface of the intermediate support member 30 close to the conductor support member 40.

The second conductive member D2 is made of conductive silver adhesive, and a method of making the conductive silver adhesive in the third opening K3 includes: disposing a conductive adhesive containing silver particles, and bonding the conductive adhesive to an inner wall of the first opening K1 and the third opening K3, to make the conductive silver adhesive and the fingerprint recognition module M not overlap each other. A hardness of the conductive adhesive is greater than a hardness of the conductive silver adhesive.

Optionally, the first opening K1 is provided along the edge of the intermediate support member 30, so that the gas in the first opening K1 can be smoothly discharged.

Optionally, a shape of an orthographic projection of each of the first opening K1 and the third opening K3 on the display panel 10 may be a square, a circle, an ellipse, or other shapes including some arcs or some squares.

In this embodiment, the first opening K1 is filled with conductive adhesive, and the strong hardness of the conductive adhesive is used to support the back plate 20 and the conductor support member 40 to prevent a height difference at the first opening K1, which is beneficial to improve flatness of the display device.

Further, the display device has a bonding connection area of an electrical terminal, and the first opening K1 is offset from the bonding connection area to prevent an effect of a thermal pressing process used in a bonding connection of the electrical terminal at the first opening K1, causing an area where the first opening K1 is located to be recessed.

Further, the first opening K1 is located in an area corresponding to a flat area of the intermediate support member 30, and the flat area refers to an area where upper and lower surfaces of the intermediate support member 30 are flat without a height difference or curvature.

Optionally, the display device further includes a fourth opening K4, the fourth opening K4 can penetrate the intermediate support member 30 and the conductor support member 40, and the fourth opening K4 is provided with an optical component, such as a camera, etc.

In summary, an embodiment of the present application provides a display device including a display panel; a back plate disposed on an opposite side of the light-exiting surface of the display panel; an intermediate support member disposed on a side of the back plate away from the display panel; and a conductor support member disposed on a side of the intermediate support member away from the back plate, wherein the intermediate support member is provided with an opening, and a conductive member is disposed in the opening, and wherein opposite ends of the first conductive member are in electrical contact with the conductive layer and the conductive member, respectively. In embodiments of the present application, the conductive layer is provided on the back plate, and the conductive layer is connected to the conductor support member through the conductive member provided in the opening of the intermediate support member, so that the static electricity generated on the back plate is conducted to the conductor support member through the conductive member, and conducted out of the display device by the conductor support member member, thereby alleviating the electrostatic accumulation on the back plate of the display device, and improving the reliability and display quality of the display device.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display device, comprising:
a display panel having a light-exiting surface;
a back plate disposed on an opposite side of the light-exiting surface of the display panel, wherein a first conductive layer is disposed on a surface of the back plate away from the display panel;
an intermediate support member disposed on a side of the back plate away from the display panel, wherein the intermediate support member is provided with a first opening, and a first conductive member is disposed in the first opening; and
a conductor support member disposed on a side of the intermediate support member away from the back plate,
wherein one end of the first conductive member is in electrical contact with the first conductive layer, and another end of the first conductive member is in electrical contact with the conductor support member.

2. The display device according to claim 1, wherein a second conductive layer is disposed on a surface of the back plate facing the display panel; and
a third conductive layer is disposed on at least one side surface of the backplane and configured to electrically connect the first conductive layer to the second conductive layer.

3. The display device according to claim 1, wherein the first conductive member comprises conductive adhesive filled in the first opening.

4. The display device according to claim 3, wherein one end of the conductive adhesive is flush with a surface of the intermediate support member close to the back plate, and is in electrical contact with the first conductive layer; and
wherein another end of the conductive adhesive is flush with a surface of the intermediate support member close to the conductor support member, and is in electrical contact with the conductor support member.

5. The display device according to claim 1, wherein the first opening is provided along an edge of the intermediate support member.

6. The display device according to claim 5, wherein the intermediate support member has a concave structure at a position corresponding to the first opening.

7. The display device according to claim 2, wherein at least one of the first conductive layer, the second conductive layer, and the third conductive layer comprises carbon black or silver particles.

8. The display device according to claim 2, wherein at least one of the first conductive layer, the second conductive layer, and the third conductive layer comprises a hydrophilic coating.

9. The display device according to claim 1, wherein the conductor support member is provided with a second opening corresponding to the first opening, and a part of the first conductive member is located in the second opening.

10. The display device according to claim 9, wherein the display device further comprises a fingerprint recognition module disposed in the first opening and the second opening; and wherein the first conductive member is disposed between the intermediate support member and the fingerprint recognition module, and between the conductor support member and the fingerprint recognition module.

11. The display device according to claim 9, wherein the first conductive member comprises conductive silver adhesive disposed in the first opening and the second opening.

12. The display device according to claim 1, wherein a shape of an orthographic projection of the first opening on the display panel is a square or a circle.

13. The display device according to claim 1, wherein the intermediate support member and the conductor support member are further provided with a third opening, and the third opening penetrates through the intermediate support member and the conductor support member; and
wherein the display device further comprises: a fingerprint recognition module disposed in the third opening, and a second conductive member disposed in the third opening and located between the fingerprint recognition module and the intermediate support member, and between the fingerprint recognition module and the conductor support member.

14. The display device according to claim 13, wherein one end of the second conductive member is in electrical contact with the first conductive layer, and another end of the second conductive member is in electrical contact with the conductor support member.

15. The display device according to claim 1, wherein the display device further comprises a bonding connection area of an electrical terminal, and the first opening is offset from the bonding connection area.

16. The display device according to claim 1, wherein the first opening is located at an area corresponding to a flat area of the intermediate support member.

17. The display device according to claim 1, wherein the intermediate support member comprises: a mesh adhesive arranged close to the back plate, and a foam disposed between the mesh adhesive and the conductor support member.

18. The display device according to claim 1, wherein the display device further comprises: a polarizer disposed on the light-exiting surface of the display panel, an optical adhesive disposed on the polarizer, and a cover plate disposed on the optical adhesive.

19. The display device according to claim 1, wherein the display device further comprises a fourth opening, the fourth opening penetrates through the intermediate support member and the conductor support member, and an optical element is disposed in the fourth opening.

20. A display device, comprising:
a display panel having a light-exiting surface;
a back plate disposed on an opposite side of the light-exiting surface of the display panel, wherein a first conductive layer is disposed on a surface of the back plate away from the display panel;
an intermediate support member disposed on a side of the back plate away from the display panel, wherein the intermediate support member is provided with a first opening, and a first conductive member is disposed in the first opening; and
a conductor support member disposed on a side of the intermediate support member away from the back plate, wherein one end of the first conductive member is in electrical contact with the first conductive layer, and another end of the first conductive member is in electrical contact with the conductor support member, wherein the display device further comprises a third opening penetrating through the intermediate support member and the conductor support member; a fingerprint recognition module is provided in the third opening; a second conductive member is disposed between the fingerprint recognition module and the intermediate support member, and between the fingerprint recognition module and the conductor support member; one end of the second conductive member is in electrical contact with the first conductive layer; and another end of the second conductive member is in electrical contact with the conductor support member.

* * * * *